US012586625B2

(12) United States Patent
Kim et al.

(10) Patent No.: US 12,586,625 B2
(45) Date of Patent: Mar. 24, 2026

(54) STATEFUL LOGIC-IN-MEMORY USING SILICON DIODES

(71) Applicant: Korea University Research and Business Foundation, Seoul (KR)

(72) Inventors: Sang Sig Kim, Seoul (KR); Kyoung Ah Cho, Seoul (KR); Jae Min Son, Seongnam-si (KR)

(73) Assignee: Korea University Research and Business Foundation, Seoul (KR)

( * ) Notice: Subject to any disclaimer, the term of this patent is extended or adjusted under 35 U.S.C. 154(b) by 270 days.

(21) Appl. No.: 18/575,511

(22) PCT Filed: Oct. 13, 2022

(86) PCT No.: PCT/KR2022/015458
§ 371 (c)(1),
(2) Date: Jul. 1, 2024

(87) PCT Pub. No.: WO2023/063733
PCT Pub. Date: Apr. 20, 2023

(65) Prior Publication Data
US 2024/0347093 A1 Oct. 17, 2024

(30) Foreign Application Priority Data
Oct. 14, 2021 (KR) ........................ 10-2021-0136449

(51) Int. Cl.
| | |
|---|---|
| *G11C 11/36* | (2006.01) |
| *H03K 19/20* | (2006.01) |
| *H10B 99/00* | (2023.01) |
| *H03K 19/21* | (2006.01) |

(52) U.S. Cl.
CPC .............. *G11C 11/36* (2013.01); *H03K 19/20* (2013.01); *H10B 99/16* (2023.02); *H03K 19/21* (2013.01)

(58) Field of Classification Search
CPC ......... G11C 11/21; G11C 11/34; G11C 11/36; H03K 19/1776; H03K 19/20; H01B 99/16
See application file for complete search history.

(56) References Cited

U.S. PATENT DOCUMENTS

| | | | |
|---|---|---|---|
| 7,365,373 B2* | 4/2008 | Nemati | .................. H10B 10/10 257/132 |
| 2018/0138199 A1* | 5/2018 | Kim | ........................ G11C 11/54 |
| 2018/0138200 A1* | 5/2018 | Kim | ........................ G11C 11/54 |

(Continued)

FOREIGN PATENT DOCUMENTS

| | | |
|---|---|---|
| KR | 10-2005-0032004 A | 4/2005 |
| KR | 10-2015-0138196 A | 12/2015 |

(Continued)

OTHER PUBLICATIONS

Korean Office Action issued on Jan. 23, 2024, in counterpart Korean Patent Application No. 10-2021-0136449 (6 pages in Korean).

*Primary Examiner* — Jason M Crawford
(74) *Attorney, Agent, or Firm* — NSIP Law

(57) ABSTRACT

Disclosed is a stateful logic-in-memory using silicon diodes. More particularly, the stateful logic-in-memory according to an embodiment of the present invention includes a plurality of silicon diodes, each of the silicon diodes includes an anode region, a first channel region, a second channel region and a cathode region and is included as a memory cell.

12 Claims, 18 Drawing Sheets

300

310

(56)             References Cited

U.S. PATENT DOCUMENTS

| | | | |
|---|---|---|---|
| 2020/0043930 A1 | 2/2020 | Luan et al. | |
| 2020/0075094 A1* | 3/2020 | Kim | G11C 11/412 |
| 2020/0075098 A1* | 3/2020 | Kim | G11C 11/4023 |
| 2021/0297221 A1 | 9/2021 | Lee et al. | |
| 2024/0347093 A1* | 10/2024 | Kim | H10D 48/30 |
| 2025/0077853 A1* | 3/2025 | Kim | G06N 3/04 |
| 2025/0211235 A1* | 6/2025 | Kim | H10D 30/611 |
| 2025/0211236 A1* | 6/2025 | Kim | G11C 11/54 |
| 2025/0275117 A1* | 8/2025 | Kim | H10D 12/211 |
| 2025/0299035 A1* | 9/2025 | Kim | G06N 3/065 |

FOREIGN PATENT DOCUMENTS

| | | |
|---|---|---|
| KR | 10-1835231 B1 | 3/2018 |
| KR | 10-2018-0035167 A | 4/2018 |
| KR | 10-1857873 B1 | 6/2018 |
| KR | 10-1975534 B1 | 5/2019 |
| KR | 10-2020-0129466 A | 11/2020 |

* cited by examiner

$V_{Hold}$  $V_{Hold}$ $V_{Read}$  $V_{Write}$

| a | b | b' |
|---|---|----|
| 0 | 0 | 1 |
| 0 | 1 | 1 |
| 1 | 0 | 0 |
| 1 | 1 | 1 |

510

520

720

| a b | | c | | a+b | c | c' |
|-----|--|---|--|-----|---|-----|
| 0 0 | | 0 | | 0 | 0 | 1 |
| 0 1 | | 0 | | 1 | 0 | 0 |
| 1 0 | | 0 | | 1 | 0 | 0 |
| 1 1 | | 0 | | 1 | 0 | 0 |

FIG. 8B

STATEFUL LOGIC-IN-MEMORY USING SILICON DIODES

CROSS-REFERENCE TO RELATED APPLICATIONS

This application is a U.S. national stage application of International Application No. PCT/KR2022/015458 filed on Oct. 13, 2022, which claims the benefit under 35 USC 119(a) of Korean Patent Application No. 10-2021-0136449 filed on Oct. 14, 2021, in the Korean Intellectual Property Office, the entire disclosure of which are incorporated herein by reference for all purposes.

TECHNICAL FIELD

The present invention relates to a stateful logic-in-memory using silicon diodes, and more particularly to a technology of implementing a stateful logic-in-memory using silicon diodes configured to perform a memory function based on a positive feedback loop and operate with two terminals.

BACKGROUND ART

In existing von Neumann-based computer systems, processor and memory are separated and data is transmitted through a bus.

However, as computing performance increased, a bottleneck occurred due to the difference in data processing speed between processor and memory, and limitations in processing large amounts of data began to be revealed.

In other words, the von Neumann-based system, a revolutionary development in the semiconductor industry, has improved the integration density and performance of modern computers, but has the disadvantage of consuming a lot of energy and requiring long data transfer and waiting times due to the physical separation between processor and memory hierarchies.

Considering the increase in data-intensive applications such as 5G communication standards, Internet of Things (IOT), and Artificial Intelligence (AI) after the Fourth Industrial Revolution, new computing paradigms are essential for large-scale data processing requirements.

To solve the above-mentioned problems, research on Logic-In-Memory (LIM) technology, which combines calculation and memory functions, is being focused and accelerated.

Because the LIM technology performs the processor's calculation function and the memory's storage function in the same space, it can reduce latency and power consumption that occur during data transmission and greatly improve system integration.

In addition, as computer performance increases, limitations in large-capacity data processing have begun to emerge, and to solve this problem, Package On Package (POP) and Through Silicon Via (TSV) technologies that integrate logic memory on a single chip are being researched.

However, as logic and a memory function are not implemented in transistors, bottleneck, power consumption, computational efficiency, and integration problems are still emerging.

Meanwhile, to solve this problem, research on a stateful logic-in-memory technology that combines logical operations and a memory function is accelerating.

The stateful logic-in-memory technology performs both memory roles and logical operations within a memory array, thereby reducing time delay and power consumption during data transmission and significantly improving system integration.

A stateful logic-in-memory using conventional Resistive Random-Access Memory (ReRAM) cannot be applied with an existing Complementary Metal-Oxide Semiconductor (CMOS) process, resulting in poor device uniformity and stability, and usability problems in that it is difficult to use in real life due to a complex process.

DISCLOSURE

Technical Problem

Therefore, the present invention has been made in view of the above problems, and it is one object of the present invention to provide a stateful Logic-In-Memory (LIM) that can perform a memory function based on a positive feedback loop and uses silicon diodes operating as two terminals.

It is another object of the present invention to provide a stateful logic-in-memory implementation technology that can be utilized in a Complementary Metal-Oxide Semiconductor (CMOS) process and has excellent uniformity and stability.

It is still another object of the present invention to address processing speed and integration limitations due to the separation of memory and processor through the implementation of a stateful Logic-In-Memory (LIM) using silicon diodes.

It is still another object of the present invention to reduce hold power by using the excellent memory characteristics of the silicon diode and to implement a stateful logic-in-memory using silicon diodes capable of increasing computational efficiency with low power consumption due to excellent switching characteristics.

It is yet another object of the present invention to implement a stateful logic-in-memory using silicon diodes capable of performing both a memory function and a logic operation function.

Technical Solution

In accordance with an aspect of the present invention, the above and other objects can be accomplished by the provision of a stateful logic-in-memory using silicon diodes, wherein the stateful logic-in-memory includes a plurality of silicon diodes respectively including an anode region, a first channel region, a second channel region and a cathode region and being respectively included as memory cells, wherein each of the plural memory cells is connected in series with a resistor after a terminal of the cathode region is connected in parallel with a terminal of another cathode region, and receives operation voltage through a terminal of the anode region, and the plural memory cells include at least one input cell and output cell, perform implication (IMP) calculation at least once based on the received operation voltage and states of the at least one input cell and output cell, and change or maintain the state of the output cell based on the IMP operation performed at least once to perform a logic operation function and a memory function.

The at least one input cell may receive one voltage of a set voltage, a hold voltage and a read voltage among the operation voltage, wherein, when the set voltage is a positive voltage, a state may be determined as a high state, thereby being turned on, and, when the set voltage is a negative voltage, a state may be determined as a low state, thereby being turned off, and the output cell may receive one voltage of a set voltage, a hold voltage and a write voltage among the operation voltage, wherein, when the set voltage is a positive voltage, a state may be determined as a high state, thereby being turned on, and, when the set voltage is a negative voltage, a state may be determined as a low state, thereby being turned off, wherein the state is maintained or changed based on the write voltage.

The plural memory cells may be turned on based on a latch-up phenomenon in the first channel region and the second channel region when the set voltage is the positive voltage corresponding to a greater voltage than a reference voltage for generating a positive feedback loop in the first channel region and the second channel region, and may be turned off based on a latch-down phenomenon in the first channel region and the second channel region when the set voltage is the negative voltage corresponding to a smaller voltage than the reference voltage.

The stateful logic-in-memory may include one input cell of the at least one input cell and the output cell, and the stateful logic-in-memory may have a larger resistance value than the resistor connected in series as the one input cell is turned off when the one input cell is in a low state and the output cell is in a low state or a high state, and may perform an IMP operation, where the output cell is changed from a low state to a high state or maintains a high state, based on the write voltage applied to the output cell because the read voltage applied to the input cell is not applied to the resistor based on the larger resistance value.

The stateful logic-in-memory may include one input cell of the at least one input cell and the output cell, and the stateful logic-in-memory may have a smaller resistance value than the resistor connected in series as the one input cell is turned on when the one input cell is in a high state and the output cell is in a low state or a high state, and may perform an IMP operation, where the output cell maintains a previous low state or high state, as the write voltage and read voltage applied to the output cell are canceled out while the read voltage applied to the input cell is applied to the resistor based on the smaller resistance value.

The stateful logic-in-memory may include one input cell of the at least one input cell and the output cell, the output cell may receive the set voltage as a negative voltage, thereby being reset to a low state, and the stateful logic-in-memory may have a larger resistance value than the resistor connected in series as the one input cell is turned off when the one input cell is in a low state and the output cell is in a low state, and may perform an IMP operation, where the output cell is changed from a low state to a high state, based on the write voltage applied to the output cell because the read voltage applied to the input cell is not applied to the resistor based on the larger resistance value.

The stateful logic-in-memory may include two input cells of the at least one input cell and the output cell, the output cell may receive the set voltage as a negative voltage, thereby being reset to a low state, the stateful logic-in-memory may perform a first IMP operation between one input cell of the two input cells and the output cell, the stateful logic-in-memory may perform a second IMP operation between another input cell of the two input cells and the output cell, and the stateful logic-in-memory may store a NAND operation result value between the one input cell and the another input cell in the output cell based on the first IMP operation and the second IMP operation.

The stateful logic-in-memory may include two input cells of the at least one input cell and the output cell, the output cell may receive the set voltage as a negative voltage, thereby being reset to a low state, the read voltage may be applied to the two input cells, and IMP operation between an OR operation result of a state of the two input cells and the output cell may be performed, and the stateful logic-in-memory may store a NOR operation result value between the one input cell and the another input cell, based on the IMP operation, in the output cell.

The stateful logic-in-memory may include first to fourth input cells of the at least one input cell and the output cell, the third and fourth input cells of the first to fourth input cells and the output cell may receive the set voltage as a negative voltage, thereby being reset to a low state, the stateful logic-in-memory may perform IMP operation between the first input cell and the third input cell to store a first operation result as a state of the third input cell, the stateful logic-in-memory may perform IMP operation between the second input cell and the fourth input cell to store a second operation result as a state of the fourth input cell, the stateful logic-in-memory may perform IMP operation between an OR operation result of the first input cell and the second operation result and the output cell to store a third operation result as a state of the output cell, and the stateful logic-in-memory may perform IMP operation between an OR operation result of the second input cell and the first operation result and the output cell to store a fourth operation result as a state of the output cell.

The anode region and the second channel region may be in a p-doped state, and the cathode region and the first channel region may be in an n-doped state.

When an electrostatically doped electrode is deposited on the first channel region, each of the plural memory cells may electrically dope the first channel region by a work function of the electrostatic doping electrode by grounding the electrostatic doping electrode, or may electrically dope the first channel region through an electric field applied by applying voltage to the electrostatic doping electrode.

Advantageous Effects

As apparent above, the present invention can implement a stateful Logic-In-Memory (LIM) that can perform a memory function based on a positive feedback loop and uses silicon diodes operating as two terminals.

The present invention can provide a stateful logic-in-memory implementation technology that can be utilized in a Complementary Metal-Oxide Semiconductor (CMOS) process and has excellent uniformity and stability.

The present invention can address processing speed and integration limitations due to the separation of memory and processor through the implementation of a stateful Logic-In-Memory (LIM) using silicon diodes.

The present invention can reduce hold power by using the excellent memory characteristics of the silicon diode and implement a stateful logic-in-memory using silicon diodes capable of increasing computational efficiency with low power consumption due to excellent switching characteristics.

The present invention can implement a stateful logic-in-memory using silicon diodes capable of performing both a memory function and a logic operation function.

DESCRIPTION OF DRAWINGS

FIGS. 4a to 4d illustrate an operation method of the stateful logic-in-memory according to an embodiment of the present invention.

FIGS. 8a and 8b illustrate the NOR logic operation of the stateful logic-in-memory according to an embodiment of the present invention.

BEST MODE

Figure 1A:
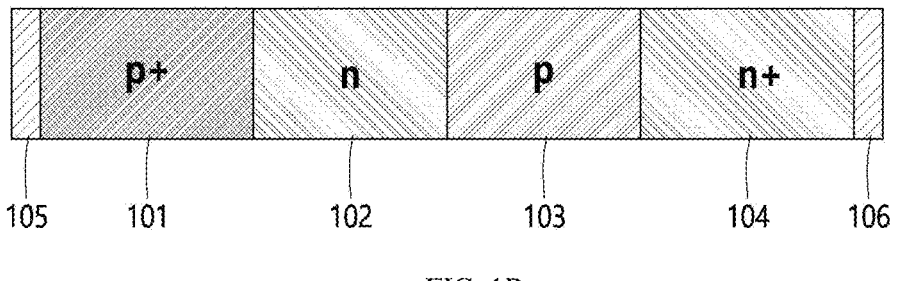
FIGS. 1a to 1d illustrate silicon diodes constituting a stateful logic-in-memory according to an embodiment of the present invention.

The embodiments will be described in detail herein with reference to the drawings.

However, it should be understood that the present invention is not limited to the embodiments according to the concept of the present invention, but includes changes, equivalents, or alternatives falling within the spirit and scope of the present invention.

In the following description of the present invention, a detailed description of known functions and configurations incorporated herein will be omitted when it may make the subject matter of the present invention unclear.

The terms used in the specification are defined in consideration of functions used in the present invention, and can be changed according to the intent or conventionally used methods of clients, operators, and users. Accordingly, definitions of the terms should be understood on the basis of the entire description of the present specification.

In description of the drawings, like reference numerals may be used for similar elements The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), it may be directly connected or coupled to the other element or an intervening element (e.g., third) may be present.

As used herein, "configured to" may be used interchangeably with, for example, "suitable for", "ability to", "changed to", "made to", "capable of", or "designed to" in terms of hardware or software.

In some situations, the expression "device configured to" may mean that the device "may do ~" with other devices or components.

For example, in the sentence "processor configured to perform A, B, and C", the processor may refer to a general-purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or".

That is, unless otherwise mentioned or clearly inferred from context, the expression "x uses a or b" means any one of natural inclusive permutations.

Terms, such as "unit" or "module", etc., should be understood as a unit that processes at least one function or operation and that may be embodied in a hardware manner, a software manner, or a combination of the hardware manner and the software manner.

FIGS. 1a to 1d illustrate silicon diodes constituting a stateful logic-in-memory according to an embodiment of the present invention.

Figure 1B:
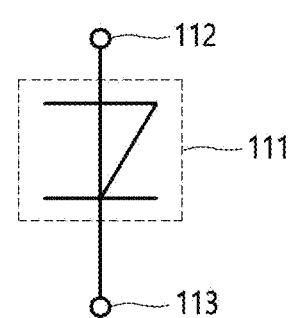
Figure 1C:
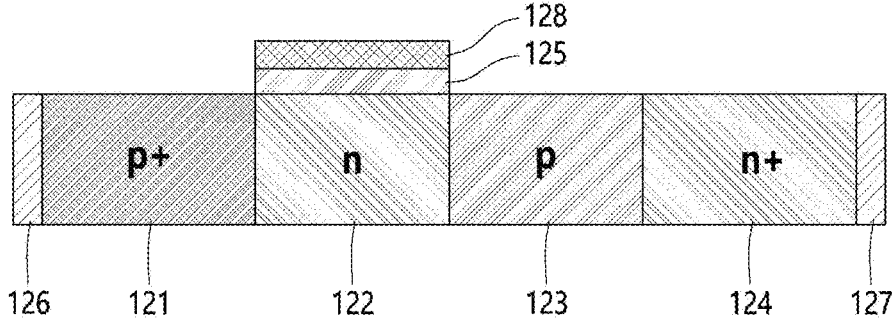

FIGS. 1a and 1c illustrate block diagrams of silicon diodes constituting the stateful logic-in-memory according to an embodiment of the present invention.

Figure 1D:
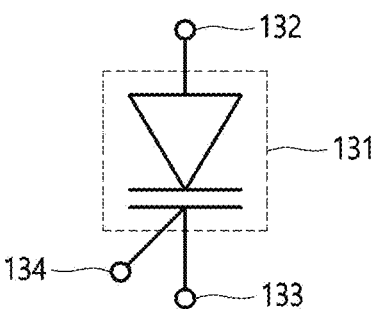

Meanwhile, FIGS. 1b and 1d illustrate circuit symbols of silicon diodes constituting the stateful logic-in-memory according to an embodiment of the present invention.

FIGS. 1a and 1b illustrate a basic p-n-p-n diode in which the channel region is entirely doped, and FIGS. 1c and 1d illustrate an electrostatic doping p-n-p-n diode in which channel region is electrically doped by depositing an electrode.

The silicon diode according to an embodiment of the present invention includes a basic p-n-p-n diode and an electrostatic doping p-n-p-n diode.

For example, the silicon diode operates with two terminals, an anode and a cathode, and latch-up and latch-down occur in the channel region based on a positive feedback loop of electrons and holes.

Latch-up occurs when a positive voltage corresponding to a voltage greater than the reference voltage for creating a positive feedback loop is applied through the anode terminal, and a positive feedback loop is created in the channel region including the first channel region and the second channel region.

The positive feedback loop may indicate the phenomenon that the potential barrier in the channel region is lowered, allowing electrons and holes to move.

Latch-down occurs when a negative voltage corresponding to a voltage less than the reference voltage for generating a positive feedback loop is applied through an anode terminal, and a negative feedback loop is created in a channel region including a first channel region and a second channel region.

The negative feedback loop may indicate that a potential barrier in a channel region increases, inhibiting the movement of electrons and holes.

According to an embodiment of the present invention, the silicon diode is turned on based on the latch-up phenomenon due to a positive feedback loop, and is turned off based on the latch-down phenomenon.

That is, the silicon diode may be turned on or turned off as a device due to a feedback loop induced by the potential barrier formed inside the channel.

For example, the silicon diode may have memory properties as holes or electrons accumulate in a potential well due to the positive feedback loop.

According to an embodiment of the present invention, when the silicon diode is configured in the form of a memory array, it can be implemented as a stateful logic-in-memory that can simultaneously perform a memory function and a logic operation function through electrical signals.

Referring to FIG. 1a, a silicon diode 100 according to an embodiment of the present invention includes an anode region 101, a first channel region 102, a second channel region 103 and a cathode region 104. In the anode region 101, an anode electrode 105 is located, so a terminal of the anode region 101 is located. In the cathode region 104, a cathode electrode 106 is located, so a terminal of the cathode region 104 is located.

According to an embodiment of the present invention, the anode region 101 and the second channel region 103 are in a p-doped state, and the first channel region 102 and the cathode region 104 are in an n-doped state.

Accordingly, the silicon diode 100 may be formed in the shape of a diode nanostructure wherein the anode region 101, the first channel region 102, the second channel region 103 and the cathode region 104 are formed in a p-n-p-n structure.

Referring to FIG. 1b, a silicon diode 110 according to an embodiment of the present invention illustrates the circuit symbol of the silicon diode 100 described in FIG. 1a.

For example, in the silicon diode 110, an anode terminal 112 and a cathode terminal 113 are connected to a diode structure 111.

The diode structure 111 includes an anode region, a first channel region, a second channel region and a cathode region. In the anode region, an anode electrode is located, so a terminal of the anode region is located. In the cathode region, a cathode electrode is located, so a terminal of the cathode region is located.

Referring to FIG. 1c, a silicon diode 120 according to an embodiment of the present invention includes an anode region 121, a first channel region 122, a second channel region 123 and a cathode region 124. In the anode region 121, an anode electrode 126 is located, so a terminal of the anode region 121 is located. In the cathode region 124, a cathode electrode 127 is located, so a terminal of the cathode region 124 is located.

In addition, in the silicon diode 120, a gate region 125 is formed on the first channel region 122 to electrically dope the first channel region 122, and an electrostatically doped electrode 128 is formed on the gate region 125.

In the silicon diode 120, the channel region including the first channel region 122 may be electrically doped through the work function of the electrostatically doped electrode 128 or the electric field according to voltage application when the electrostatically doped electrode 128 is deposited on the first channel region 122 through the gate region 125.

According to an embodiment of the present invention, the anode region 121 and the second channel region 123 are in a p-doped state, and the first channel region 122 and the cathode region 124 are in an n-doped state.

Accordingly, the silicon diode 120 may be formed in the shape of a diode nanostructure wherein the anode region 121, the first channel region 122, the second channel region 123 and the cathode region 124 are formed in a p-n-p-n structure.

Referring to FIG. 1d, a silicon diode 130 according to an embodiment of the present invention illustrates the circuit symbol of the silicon diode 120 illustrated in FIG. 1c.

For example, in the silicon diode 130, an anode terminal 132, a cathode terminal 133 and a doped electrode terminal 134 are connected to a diode structure 131.

The diode structure 131 includes an anode region, a first channel region, a second channel region and a cathode region. In the anode region, an anode electrode is located, so a terminal of the anode region is located. In the cathode region, a cathode electrode is located, so a terminal of the cathode region is located.

In addition, in the silicon diode 130, a gate region is formed on the first channel region to electrically dope the first channel region, and an electrostatically doped electrode is formed on the gate region.

Therefore, the present invention can implement stateful Logic-In-Memory (LIM) configured to perform a memory function based on a positive feedback loop and to use silicon diodes operating with two terminals.

Figure 2:
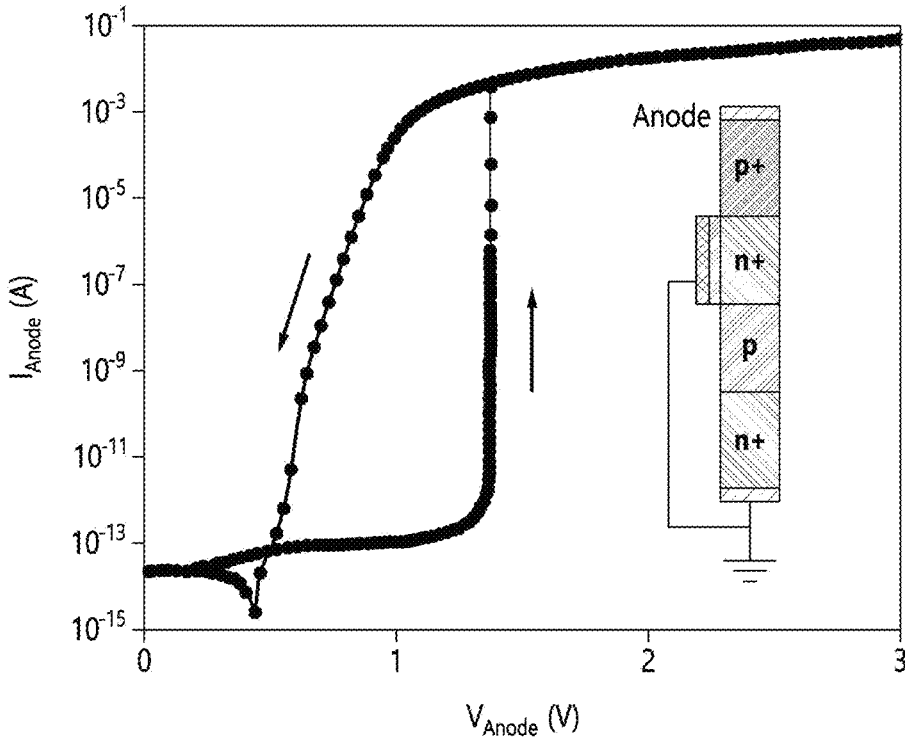
FIG. 2 illustrates the electrical characteristics of the silicon diode according to an embodiment of the present invention.

FIG. 2 illustrates the electrical characteristics of the silicon diode according to an embodiment of the present invention.

FIG. 2 illustrates the electrical characteristics of the silicon diode according to a change in current according to the application of voltage through the anode terminal of the silicon diode according to an embodiment of the present invention.

Referring to FIG. 2, graph 200 shows a change in voltage when the silicon diode receives/voltage through the terminal of the anode region (p+).

That is, graph 200 shows a voltage-current curve representing a change in current according to voltage applied to the silicon diode.

The silicon diode may perform read and write operations when a voltage of 1V to 2V is applied through the anode terminal.

For example, the silicon diode may record the state of the memory cell formed by the silicon diodes as a high state when a positive voltage of 1V to 2V as a write light voltage is applied through the anode terminal.

In addition, the silicon diode may read the state of the memory cell formed by the silicon diodes when a positive voltage of 1V to 2V as a read voltage is applied through the anode terminal.

In addition, the silicon diode may record the state of the memory cell formed by the silicon diodes as a low state when a negative voltage of 0V or less is applied through the anode terminal.

Figure 3A:
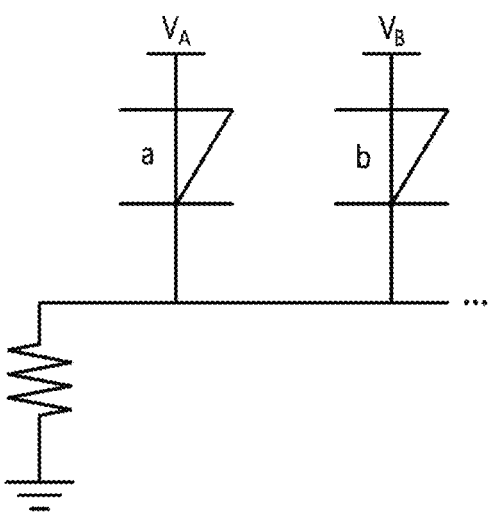
FIGS. 3a to 3c illustrate the circuit diagrams of the stateful logic-in-memory according to an embodiment of the present invention.
Figure 3B:
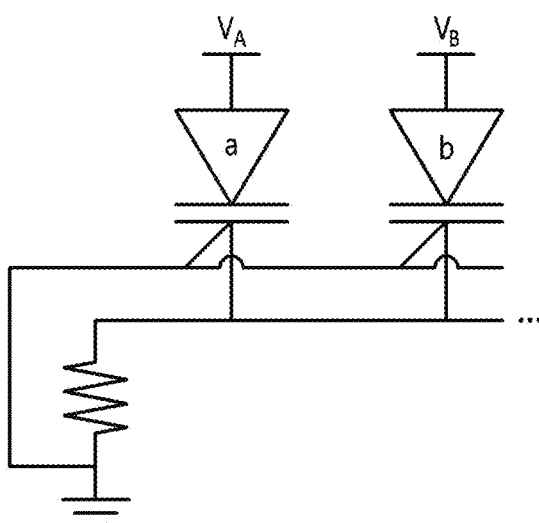
Figure 3C:
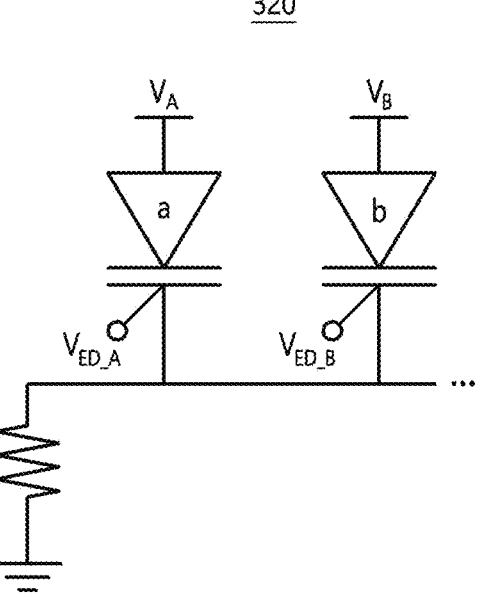

FIGS. 3a to 3c illustrate the circuit diagrams of the stateful logic-in-memory according to an embodiment of the present invention.

FIG. 3a illustrates a stateful logic-in-memory composed of the silicon diode illustrated in FIGS. 1a and 1b, and FIGS. 3b and 3c illustrate a stateful logic-in-memory composed of the silicon diode illustrated in FIGS. 1c and 1d.

Referring to FIG. 3a, a stateful logic-in-memory 300 according to an embodiment of the present invention using the silicon diode includes an input cell a and an output cell b. Voltage $V_A$ is applied to an anode terminal of the input cell, and voltage $V_B$ is applied to an anode terminal of the output cell b.

In each of the plural memory cells including the input cell a and the output cell b, a terminal of a cathode region may be connected in parallel with a terminal of another cathode region and then connected in series with a resistor, and operation voltage may be applied through a terminal of an anode region.

For example, when the terminal of the cathode region is a terminal of a cathode region of the input cell, a terminal of another cathode region may be a terminal of a cathode region of the output cell b.

Referring to FIG. 3b, a stateful logic-in-memory 310 according to an embodiment of the present invention using a silicon diode includes an input cell a and an output cell b. Voltage $V_A$ is applied to an anode terminal of the input cell a, and voltage $V_B$ is applied to an anode terminal of the output cell b.

The silicon diode constituting the input cell a and the output cell b is an electrostatic doping silicon diode. an electrostatic doping electrode is grounded, and the channel region of the silicon diode is doped by the work function of the electrode.

In each of the plural memory cells including the input cell a and the output cell b, a terminal of a cathode region may be connected in parallel with a terminal of another cathode region, and then connected in series with a resistor, and operation voltage may be applied through a terminal of an anode region.

For example, when the terminal of the cathode region is a terminal of a cathode region of the input cell a, the terminal of the other cathode region may be a terminal of a cathode region of the output cell b.

In the stateful logic-in-memory 310, a latch-up phenomenon occurs due to a positive feedback loop when voltage is increased in a positive direction through the anode terminal in a state in which the electrostatic doping electrode is grounded, and memory and logic operation functions may be performed using the silicon diode with high and low states.

According to an embodiment of the present invention, the stateful logic-in-memory 310 includes each of the plural silicon diodes respectively including the anode region, the first channel region, the second channel region and the cathode region as a memory cell For example, each of the plural memory cells is connected in series with the resistor after the terminal of the cathode region is connected in parallel with the terminal of the other cathode region, and may be applied with the operation voltage through the terminal of the anode region.

According to an embodiment of the present invention, the plural memory cells include at least one input cell and output cell.

In addition, the plural memory cells perform implication (IMP) calculation at least once based on operation voltage applied through the anode terminal and the state of at least one input cell and output cell.

Accordingly, the stateful logic-in-memory 310 may perform a logic operation function and a memory function by changing or maintaining the state of the output cell based on the IMP 1 operation performed at least once based on the plural memory cells Referring to FIG. 3c, a stateful logic-in-memory 320 including silicon diodes according to an embodiment of the present invention includes an input cell a and an output cell b. Voltage $V_A$ is applied to an anode terminal of the input cell, and voltage $V_B$ is applied to an anode terminal of the output cell b.

The silicon diode constituting the input cell a and the output cell b is an electrostatic doping silicon diode, and electrically dopes the channel through an electric field according to voltage applied through an electrostatic doping electrode.

For example, the terminal of the electrostatic doping electrode includes the terminal $V_{ED\_A}$ of the input cell a and the terminal $V_{ED\_B}$ of the output cell b.

In each of the plural memory cells including the input cell a and the output cell b, a terminal of a cathode region may be connected in parallel with a terminal of another cathode region, and then connected in series with a resistor, and operation voltage may be applied through a terminal of an anode region.

For example, when the terminal of the cathode region is a terminal of a cathode region of the input cell a, the terminal of the other cathode region may be a terminal of a cathode region of the output cell b.

The stateful logic-in-memory uses silicon diodes to read memory values stored in the channel region or perform logic operations based on voltage applied through the anode terminal of the silicon diode.

Accordingly, the present invention can utilize the Complementary Metal-Oxide Semiconductor (CMOS) process and provide a stateful logic-in-memory implementation technology with excellent uniformity and stability.

In addition, the present invention can address processing speed and integration limitations due to the separation of memory and processor through the implementation of stateful Logic-In-Memory (LIM) using silicon diodes.

FIGS. 4a to 4d illustrate an operation method of the stateful logic-in-memory according to an embodiment of the present invention.

FIGS. 4a to 4d illustrate an operation method of the stateful logic-in-memory according to an embodiment of the present invention through implication (IMP) calculation according to the state of an input cell and an output cell constituting the stateful logic-in-memory.

According to an embodiment of the present invention, the stateful logic-in-memory uses a silicon diode as a memory cell, and includes a plurality of memory cells.

The operation method of the stateful logic-in-memory uses the silicon diode illustrated in FIG. 1c, and the circuit structure is explained with reference to the circuit structure illustrated in FIG. 3B.

The plural memory cells may include at least one input cell and output cell, implication (IMP) calculation may be performed at least once based on an operation voltage applied through an anode terminal of each memory cell and a preset state for at least one input cell and output cell, and a logic operation function and a memory function may be performed by changing or maintaining the state of the output cell based on the IMP operation at least once performed.

The at least one input cell may receive one voltage of operation voltages, i.e., a set voltage, a hold voltage and a read voltage, through an anode terminal. When the set voltage is a positive voltage, the state is determined as a high state, thereby being turned on, and when the set voltage is a negative voltage, the state is determined as a low state, thereby being turned off.

The output cell may receive one voltage of operation voltages, i.e., a set voltage, a hold voltage and a write voltage, through an anode terminal. When the set voltage is a positive voltage, the state is determined as a high state, thereby being turned on, and when the set voltage is a negative voltage, the state is determined as a low state, thereby being turned off.

In addition, in the output cell, the preset state may be maintained or changed based on the write voltage.

Accordingly, the stateful logic-in-memory may perform both a logic operation function and a memory function.

In addition, the plural memory cells may be turned on based on the latch-up phenomenon in the first channel region and second channel region when the set voltage is a positive voltage corresponding to a voltage greater than the reference voltage for generating a positive feedback loop in the first channel region and the second channel region.

In addition, the plural memory cells may be turned off based on the latch-down phenomenon in the first channel region and second channel region when the set voltage is a negative voltage corresponding to a voltage smaller than the reference voltage.

According to an embodiment of the present invention, the operation method of the stateful logic-in-memory may store logic operation values in memory cells by applying read voltage $V_{Read}$ to a memory cell corresponding to an input and applying write voltage $V_{Write}$ to a memory cell corresponding to an output.

Figure 4A:
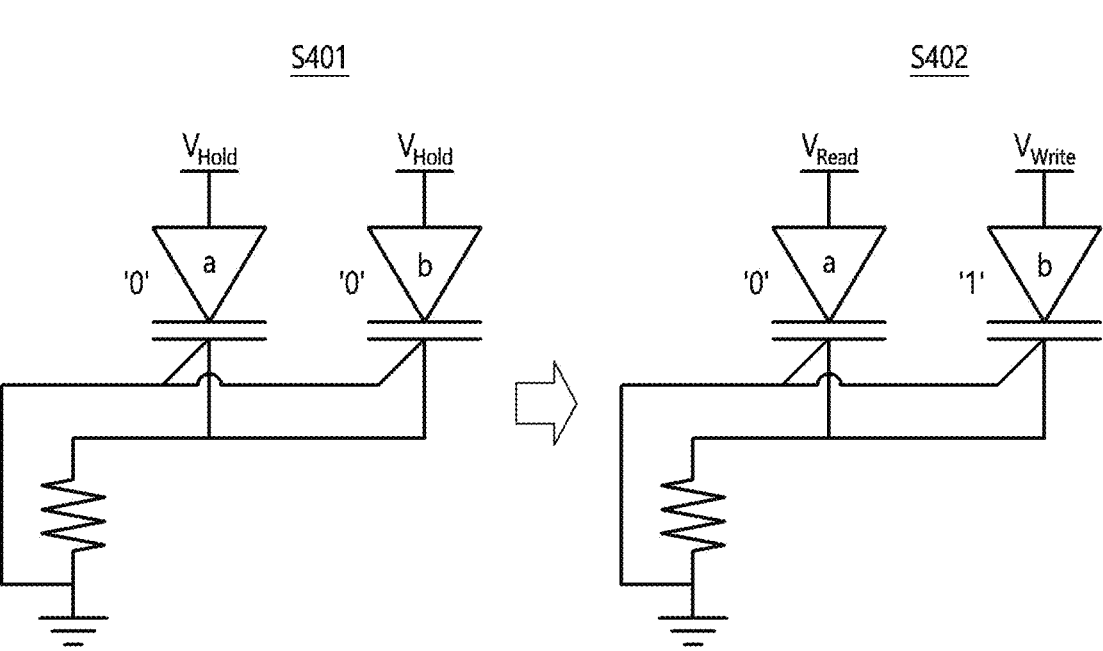

FIG. 4a illustrates performing IMP operation between the input cell and the output cell when the input cell and the output cell are in a low state, in the operation method of the stateful logic-in-memory according to an embodiment of the present invention.

Referring to FIG. 4a, in step S401, the operation method of the stateful logic-in-memory maintains a previous state, a low state, by applying hold voltage $V_{Hold}$ to the input cell a and the output cell b.

In step S402, the operation method of the stateful logic-in-memory applies the read voltage $V_{Read}$ to the input cell a, and applies the write voltage $V_{Write}$ to the output cell b.

When both the input cell a and the output cell b are in a low state, the input cell a is turned off, so it has a resistance value much larger than a resistor connected in series.

Accordingly, since the read voltage $V_{Read}$ is not applied to a resistor connected in series, the write voltage $V_{Write}$ is completely applied to the output cell b, and a write operation is performed as the state of the output cell b changes from a low state to a high state.

That is, when the input cell a and the output cell b are respectively in states of '0' and '0', the logic operation function wherein the state of the output cell b is changed and output to '1' and the memory function wherein the logic operation result is stored in the output cell b may be performed together.

Figure 4B:
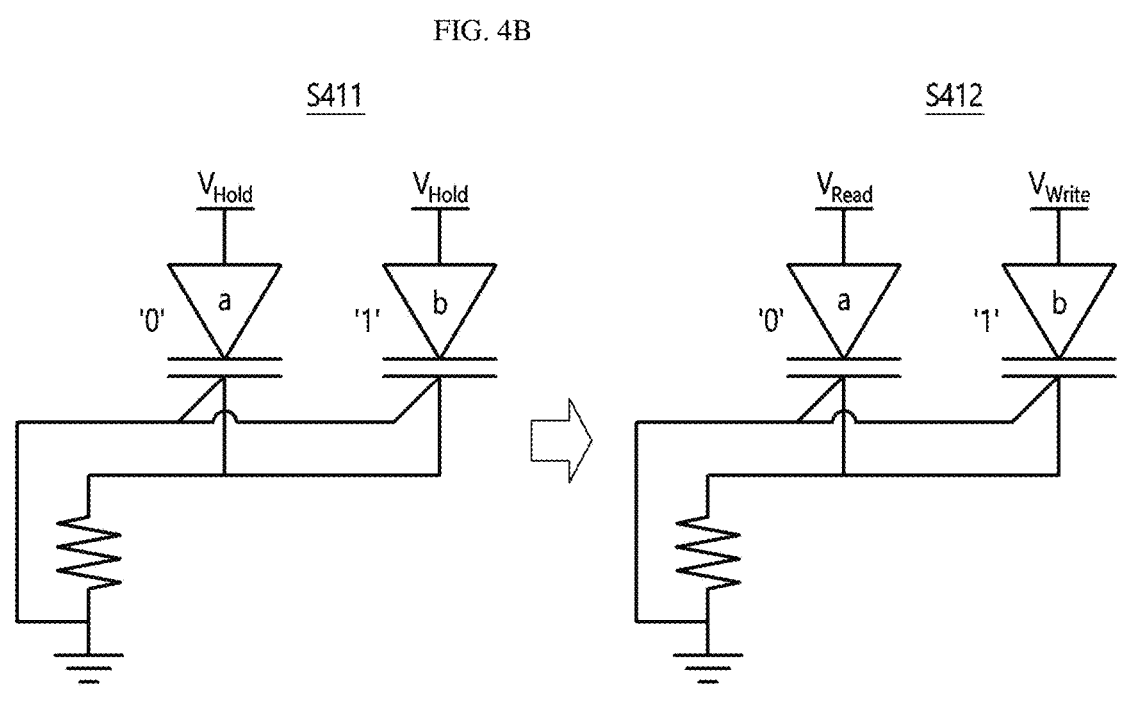

Referring to FIG. 4b, in step S411 of the operation method of the stateful logic-in-memory, the hold voltage $V_{Hold}$ is applied to the input cell a and the output cell b to maintain previous states, i.e., a low state and a high state.

In step S412 of the operation method of the stateful logic-in-memory, read voltage $V_{Read}$ is applied to the input cell a, and write voltage $V_{Write}$ is applied to the output cell b.

When the input cell a is in a low state, the input cell a is turned off, so it has a resistance value much larger than a resistor connected in series.

Accordingly, the read voltage $V_{Read}$ is not applied to a resistor connected in series, so a write operation is performed as the write voltage $V_{Write}$ is completely applied to the output cell b and the state of the output cell b is maintained in a high state.

That is, when the states of the input cell a and the output cell b are respectively '0' and '1', the logic operation function wherein the state of the output cell b is maintained in '1' and the memory function wherein the maintained logic operation result of the output cell b is stored may be performed together.

Figure 4C:
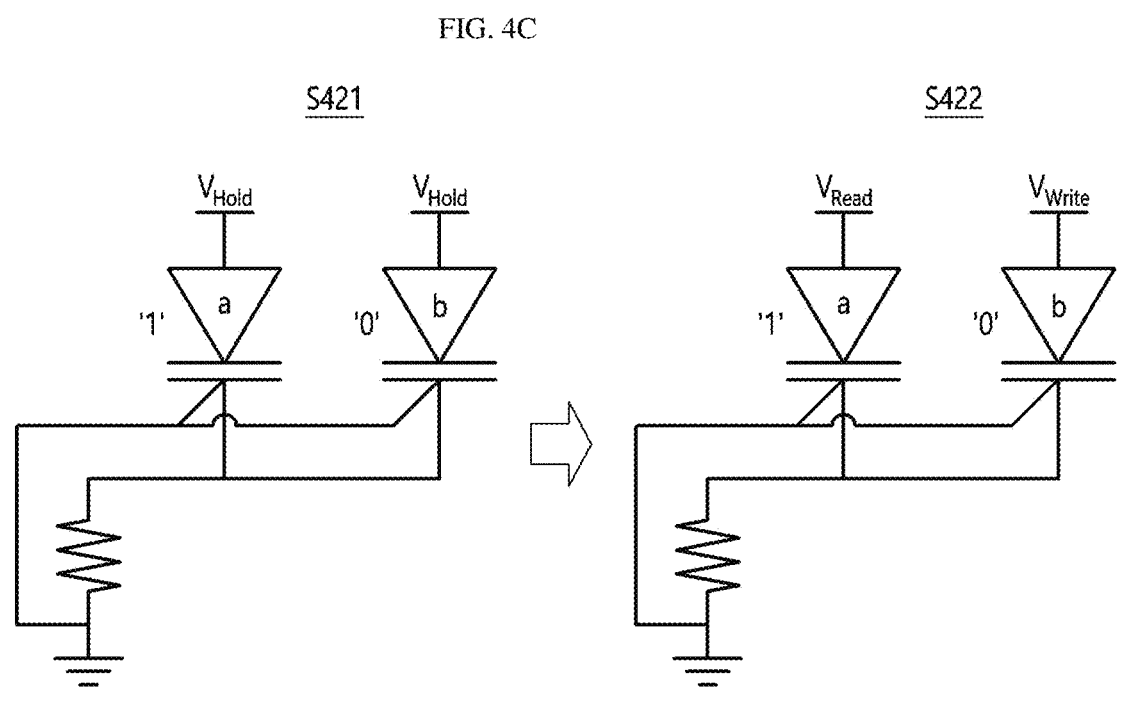

Referring to FIG. 4c, in step S421 of the operation method of the stateful logic-in-memory, hold voltage $V_{Hold}$ is applied to the input cell a and the output cell b, so the previous states, i.e., a high state and a low state, are maintained.

In step S412 of the operation method of the stateful logic-in-memory, the read voltage $V_{Read}$ is applied to the input cell a, and the write voltage $V_{Write}$ is applied to output cell b.

When the input cell a is in a high state, the input cell a is turned on, so it has a resistance value much smaller than the resistance connected in series.

Accordingly, the read voltage $V_{Read}$ is applied to a resistor connected in series, and the write voltage $V_{Write}$ and read voltage $V_{Read}$ of the output cell b are canceled out, so the write operation does not proceed, and thus, the original state of the output cell b is maintained.

That is, when the input cell a and the state of the output cell b are respectively '1' and '0', the logic operation function wherein the state of the output cell b is maintained at '0' and the memory function wherein the logic operation result maintained in the output cell b is stored may be performed together.

Figure 4D:
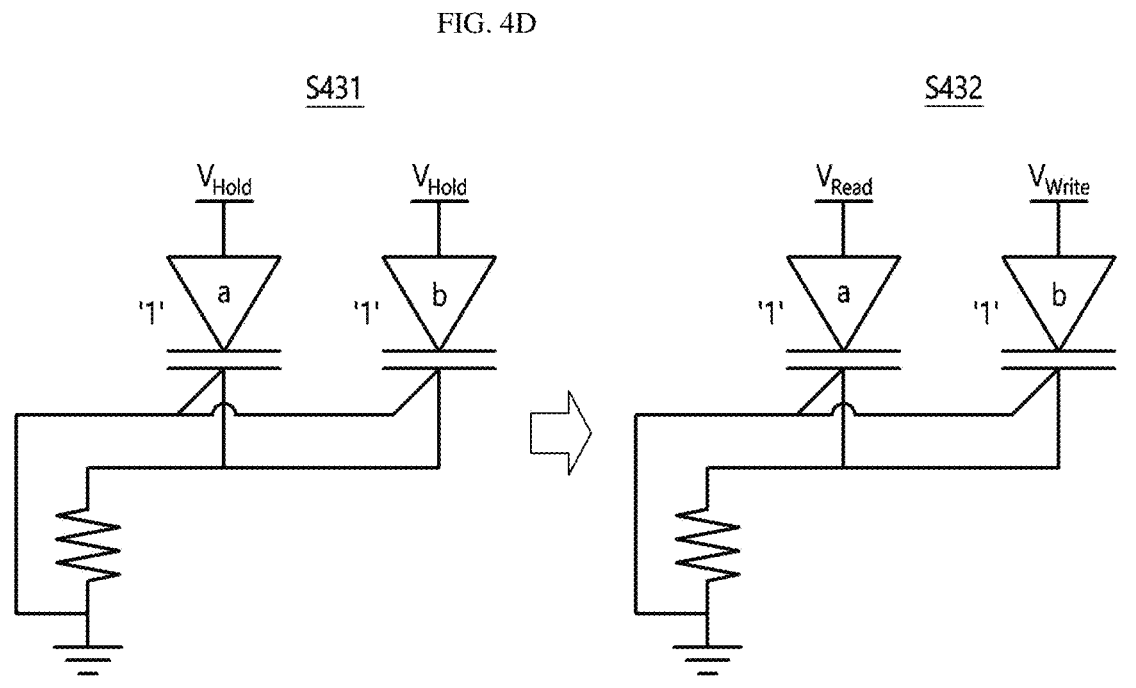

Referring to FIG. 4d, in step S431 of the operation method of the stateful logic-in-memory, the hold voltage $V_{Hold}$ is applied to the input cell a and the output cell b to maintain the previous states, a high state and a low state.

In step S432 of the operation method of the stateful logic-in-memory, the read voltage $V_{Read}$ is applied to the input cell a, and the write voltage $V_{write}$ is applied to the output cell b.

When the input cell a is in a high state, the input cell a is turned on, so it has a resistance value much smaller than the resistance connected in series.

Accordingly, the read voltage $V_{Read}$ is applied to a resistor connected in series, and the write voltage $V_{Write}$ and read voltage $V_{Read}$ of the output cell b are canceled out, so the write operation does not proceed, and thus, the original state of the output cell b is maintained.

That is, when the input cell a and the output cell b are respectively in states of '1' and '1', the logic operation function wherein the state of the output cell b is maintained at '1' and the memory function wherein the logic operation result maintained in the output cell b is stored may be performed together.

The IMP operation described above can be equally applied to a logic operation to be described with reference to FIGS. 5a to 9b.

According to an embodiment of the present invention, the stateful logic-in-memory includes one input cell of at least one input cell and one output cell, it has a larger resistance value than a resistor connected in series as the input cell is turned off when the input cell is in a low state and the output cell is in a low state or a high state, and IMP operation wherein the output cell is changed from a low state to a high state or maintains a high state may be performed based on the write voltage applied to the output cell because the read voltage applied to the input cell is not applied to the resistor based on the large resistance value.

For example, the stateful logic-in-memory has a resistance value smaller than a resistor connected in series as one input cell is turned on when the input cell is in a high state and an output cell is in a low state or a high state, and the IMP operation wherein the output cell maintains the previous low state or high state may be performed as the write voltage and read voltage applied to the output cell are canceled out while the read voltage applied to the input cell is applied to the resistor based on the small resistance value.

Accordingly, the present invention can reduce hold power by using the excellent memory characteristics of the silicon diode and can implement a stateful logic-in-memory using silicon diodes capable of increasing computational efficiency with low power consumption due to excellent switching characteristics.

Figure 5A:
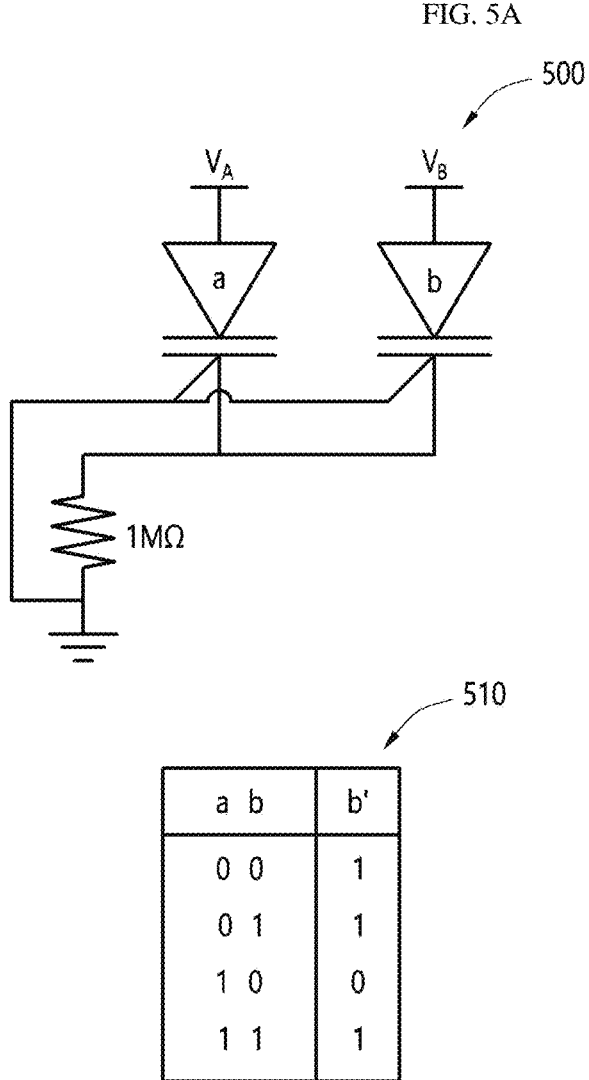
FIGS. 5a and 5b illustrate the implication (IMP) calculation of the stateful logic-in-memory according to an embodiment of the present invention.
Figure 5B:
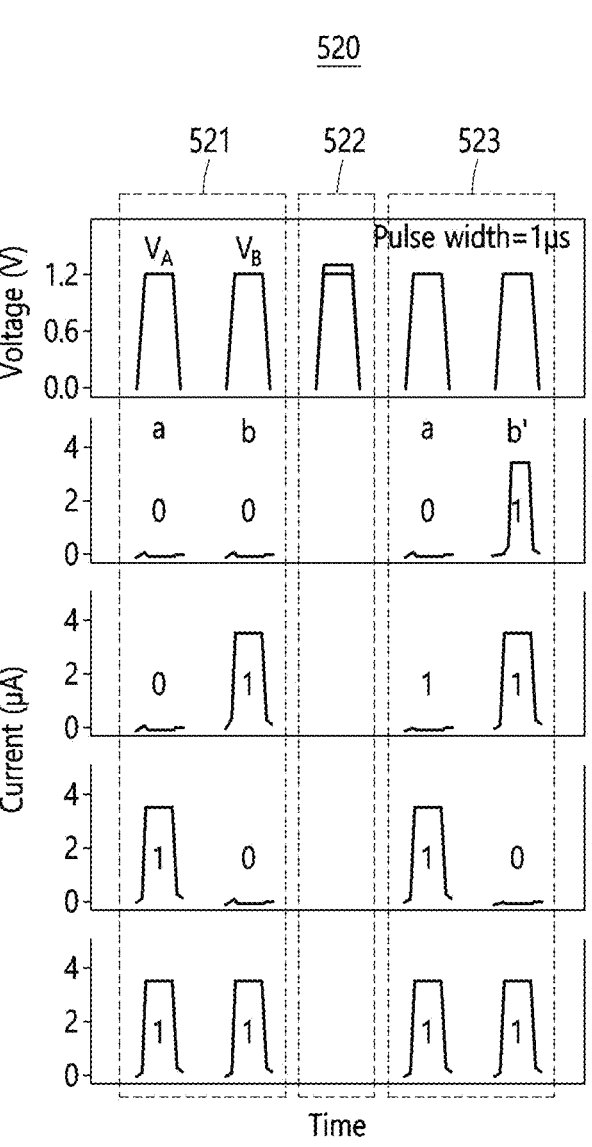

FIGS. 5a and 5b illustrate the implication (IMP) calculation of the stateful logic-in-memory according to an embodiment of the present invention.

FIGS. 5a and 5b illustrate the IMP operation of the stateful logic-in-memory using the silicon diode described with reference to FIGS. 4a to 4d.

Referring to FIG. 5a, the stateful logic-in-memory 500 may output and record IMP operation results through a state change b' of an output cell according to the states of the input cell a and the output cell b in a truth table 510 by applying operation voltages $V_A$ and $V_B$ to the input cell a and the output cell b through the anode terminal.

The stateful logic-in-memory 500 uses the silicon diode illustrated in FIG. 1c, and electrically dopes the channel region by the work function of the electrostatic doping electrode as the electrostatic doping electrode is connected to the ground.

The IMP operation of the stateful logic-in-memory 500 uses two silicon diodes connected in parallel with a series resistance of 1 MΩ.

FIG. 5b illustrates an operation timing diagram of the stateful logic-in-memory 500 of FIG. 5a.

Referring to FIG. 5b, the timing diagram 520 divides a lead input section 521, IMP operation section 522 and read output section 523 where the operation voltages $V_A$ and $V_B$ are input to the input cell a and the output cell b through the anode terminal, and show changes in the magnitude of voltage applied to each of the sections and changes in a current applied thereto.

The timing diagram 520 shows that, when IMP operation between the input cell a and the output cell b is performed as a read voltage $V_{Read}$ of 1.2V and a write voltage $V_{Write}$ of 1.3 V are applied to the input cell a, the IMP operation result is reflected in the output cell b.

From the timing diagram 520, it can be confirmed that the current measurement result corresponds to the truth table 510.

Figure 6A:
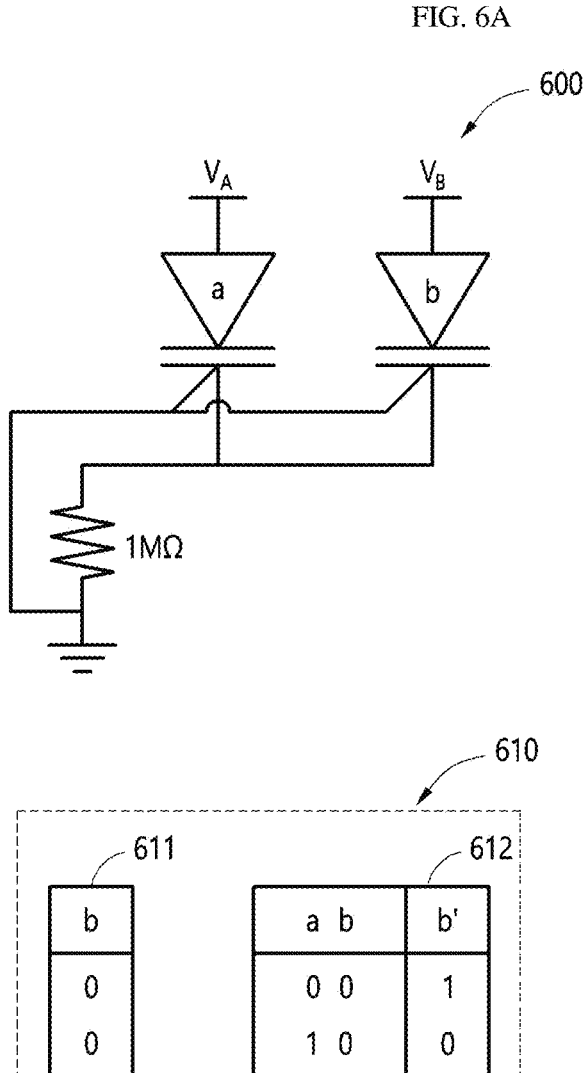
FIGS. 6a and 6b illustrate the NOT logic operation of the stateful logic-in-memory according to an embodiment of the present invention.
Figure 6B:
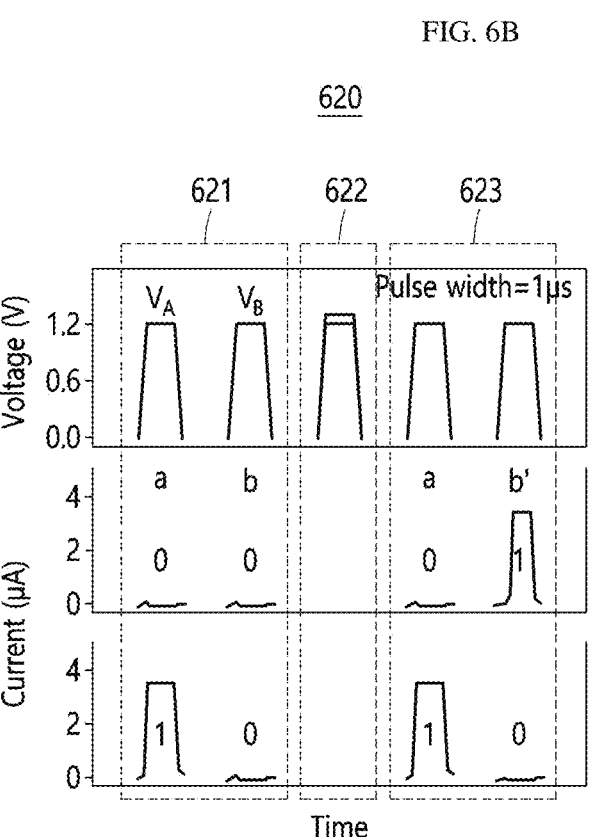

FIGS. 6a and 6b illustrate the NOT logic operation of the stateful logic-in-memory according to an embodiment of the present invention.

FIGS. 6a and 6b illustrate NOT operation according to the IMP operation of the stateful logic-in-memory using the silicon diode of the present invention.

Referring to FIG. 6a, a stateful logic-in-memory 600 may output and record IMP operation results through the state change b' of the output cell according to the states of the input cell a and the output cell b in a truth table 610 by applying the operation voltages $V_A$ and $V_B$ to the input cell a and the output cell b through the anode terminal.

The truth table 610 is divided into a first step 611 and a second step 612. The first step is a step for initializing the state of the output cell b for the NOT operation, and second step includes a step of performing IMP operation for the NOT operation.

The first step 611 may be a step of applying a negative voltage to the anode terminal of the output cell b and initializing the state.

The stateful logic-in-memory 600 implements NOT operation using two silicon diodes and through one IMP operation.

The stateful logic-in-memory 600 uses the silicon diode illustrated in FIG. 1c, and electrically dopes the channel region by the work function of the electrostatic doping electrode as the electrostatic doping electrode is connected to the ground.

The IMP operation of the stateful logic-in-memory 600 uses two silicon diodes connected in parallel with a series resistance of 1 MΩ.

FIG. 6b illustrates an operation timing diagram of the stateful logic-in-memory 600 of FIG. 6a.

Referring to FIG. 6b, a timing diagram 620 divides a lead input section 621, IMP operation section 622 and read output section 623 where the operation voltages $V_A$ and $V_B$ are input to the input cell a and the output cell b through the anode terminal, and show changes in the magnitude of voltage applied to each of the sections and changes in current applied thereto.

The timing diagram 620 shows that, when a read voltage $V_{Read}$ of 1.2 V and a write voltage $V_{Write}$ of 1.3 V are applied to the input cell a and, accordingly, IMP operation between the input cell a and the output cell b is performed, the IMP operation result is reflected in the output cell b.

According to an embodiment of the present invention, the stateful logic-in-memory includes an input cell and an output cell, and the output cell may receive a negative voltage as a set voltage, thereby being reset to a low state.

In addition, when the input cell is in a low state and the output cell is in a low state, the stateful logic-in-memory has a larger resistance value than a resistor connected in series as the input cell is turned off, and may perform the IMP operation, wherein the output cell is changed from a low state to a high state, based on the write voltage applied to the output cell as the read voltage applied to the input cell is not applied to the resistor based on the large resistance value.

In addition, when the input cell is in a high state and the output cell is in a low state, the stateful logic-in-memory has a resistance value smaller than a resistor connected in series as the input cell is turned on, and may perform IMP operation wherein the output cell maintains the previous low state as the read voltage applied to the input cell is applied to the resistor based on the small resistance value and, accordingly, the write voltage and read voltage applied to the output cell are canceled out.

That is, the stateful logic-in-memory may perform a NOT operation of reflecting a state opposite to the state of the input cell to the output cell.

In addition, from the timing diagram 620, it can be confirmed that the current measurement result corresponds to the truth table 610.

Figure 7A:
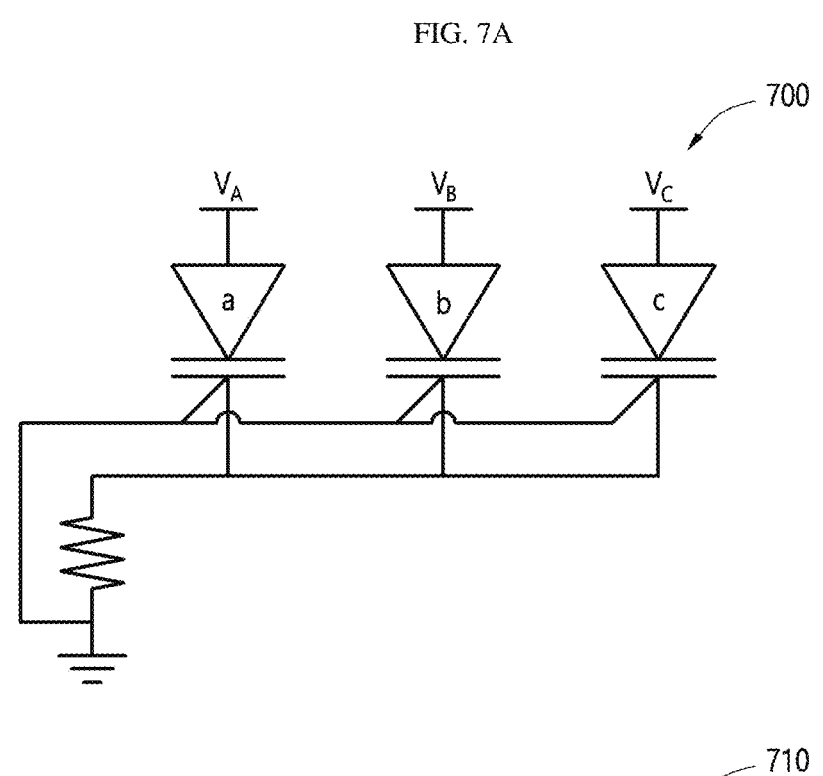
FIGS. 7a and 7b illustrate the NAND logic operation of the stateful logic-in-memory according to an embodiment of the present invention.
Figure 7B:
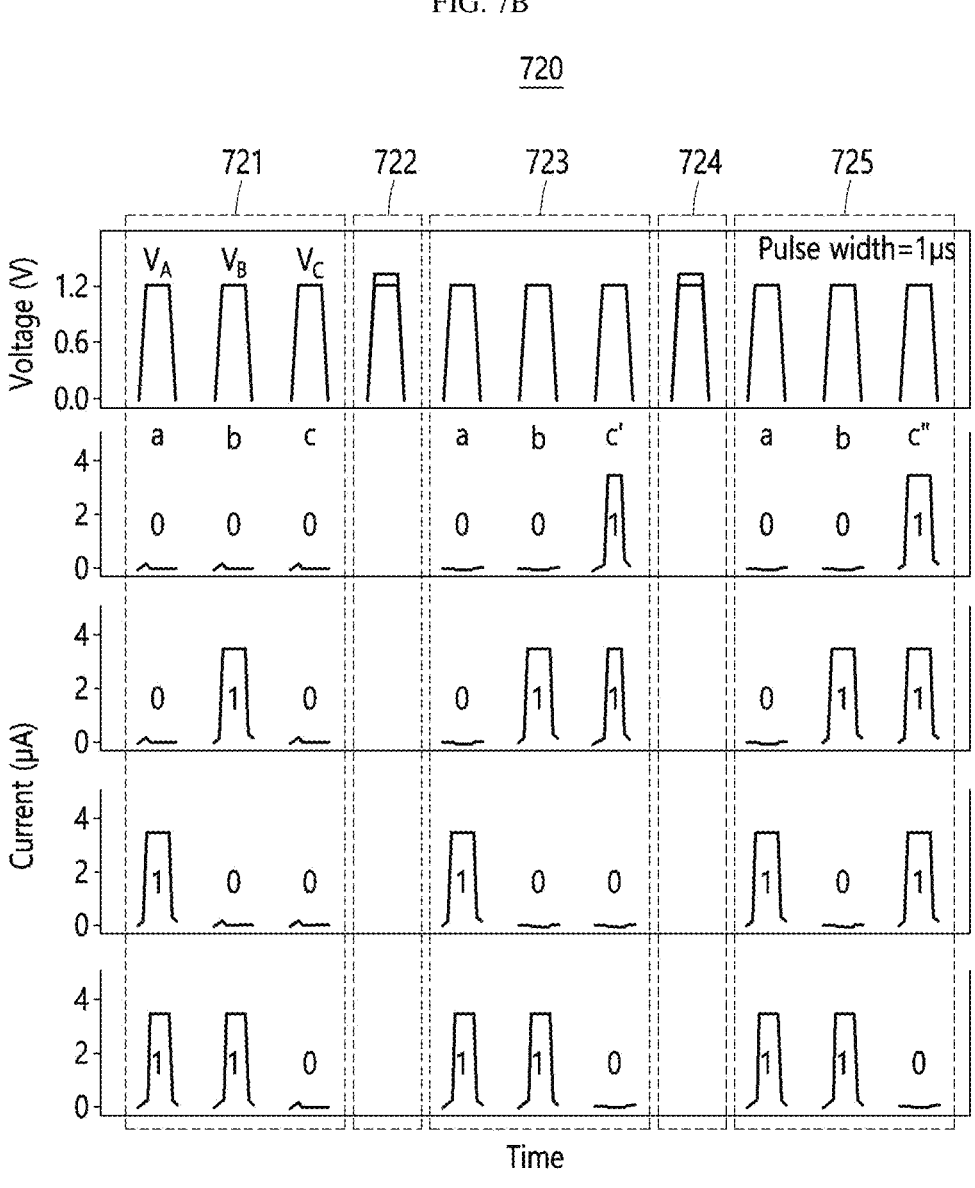

FIGS. 7a and 7b illustrate the NAND logic operation of the stateful logic-in-memory according to an embodiment of the present invention.

FIGS. 7a and 7b illustrate a NAND operation according to the IMP operation of the stateful logic-in-memory using the silicon diode of the present invention.

Referring to FIG. 7a, a stateful logic-in-memory 700 may output and record IMP operation results through a state change c' and state change c" of an output cell according to states of an input cell a, input cell b and output cell c in a truth table 710 by applying operation voltages $V_A$, $V_B$ and $V_C$ to the input cell a, the input cell b and the output cell c through an anode terminal.

The truth table 710 may be divided into a first step 711, a second step 712 and a third step 713. The first step 711 is a step of initializing the state of the output cell c for NAND operation, the second step 712 is a step of performing a first IMP operation between the input cell a and output cell c for NAND operation, and the third step 713 is a step of performing the second IMP operation between the input cell b and the output cell c' for NAND operation.

The first step 711 may be a step of applying a negative voltage to the anode terminal of the output cell c to initialize the state.

The stateful logic-in-memory 700 implements NAND operation using three silicon diodes and two IMP operations.

The stateful logic-in-memory 700 uses the silicon diode described in FIG. 1c, and electrically dopes the channel region by the work function of an electrostatic doping electrode as the electrostatic doping electrode is connected to the ground.

The IMP operation of the stateful logic-in-memory 700 uses two silicon diodes connected in parallel with a series resistance of 1 MΩ.

FIG. 7b illustrates an operation timing diagram of the stateful logic-in-memory 700 of FIG. 7a.

Referring to FIG. 7b, a timing diagram 720 divides a lead input section 721, first IMP operation section 722, first read output section 723, second IMP operation section 724 and second read output section 725 where the operation voltages $V_A$, $V_B$ and $V_C$ are input to the input cell a, the input cell b and the output cell c through the anode terminal, and illustrate changes in the magnitude of voltage applied to each of the sections and changes in current applied thereto.

The timing diagram 720 illustrates that when a read voltage $V_{Read}$ of 1.2 V and a write voltage $V_{Write}$ of 1.3 V are applied to the input cell a and the input cell b and IMP operation is performed between the input cell a, the input cell b and the output cell c, the IMP operation result is reflected in the output cell c.

That is, the stateful logic-in-memory may perform NAND operation between the state of the input cell a and the state of the input cell b based on the plural memory cells, composed of two input cells and one output cell, and the IMP operation.

In addition, from the timing diagram 720, it can be confirmed that the current measurement results correspond to the truth table 710.

Figure 8A:
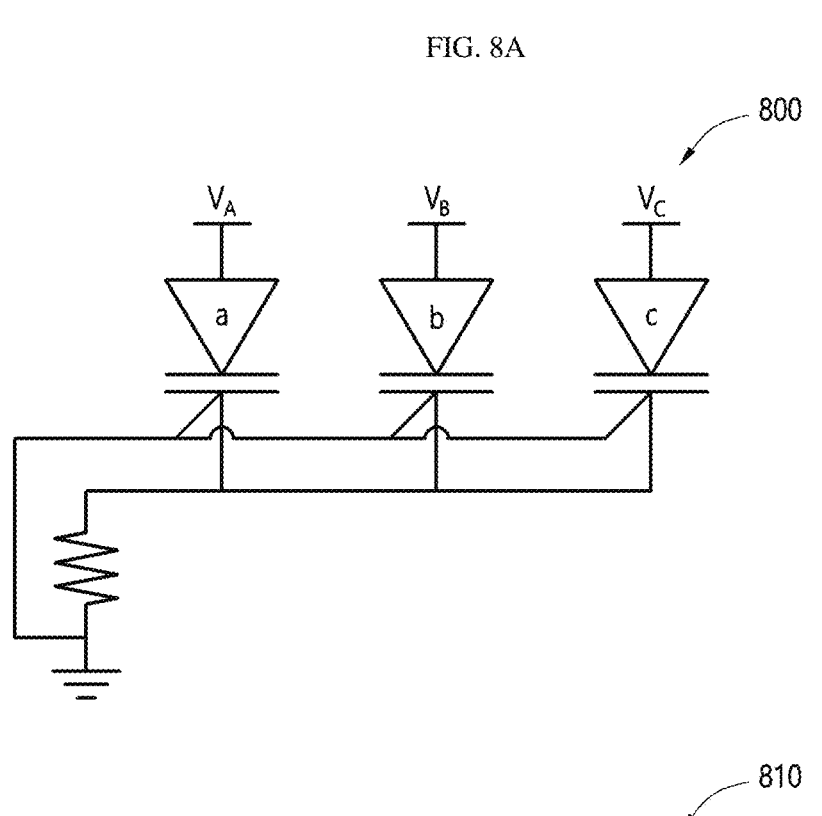
Figure 8B:
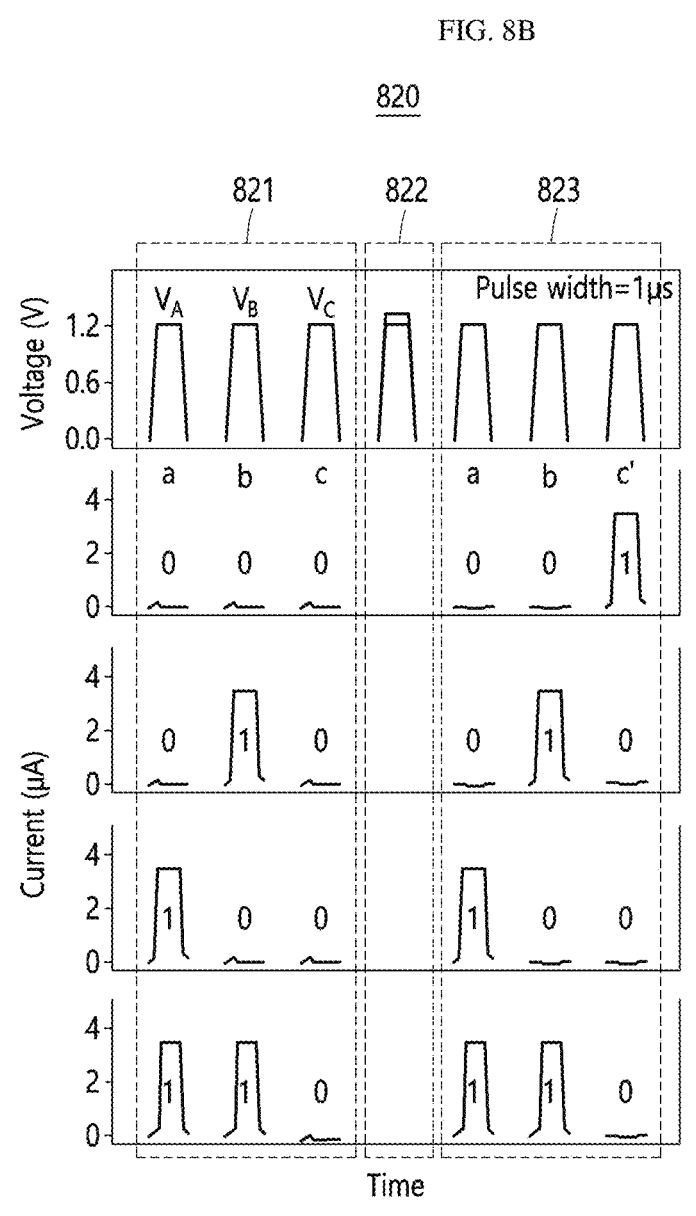

FIGS. 8a and 8b illustrate the NOR logic operation of the stateful logic-in-memory according to an embodiment of the present invention.

FIGS. 8a and 8b illustrate NOR operation according to the IMP operation of the stateful logic-in-memory using the silicon diode of the present invention.

Referring to FIG. 8a, a stateful logic-in-memory 800 applies operation voltages $V_A$, $V_B$ and $V_C$ to an input cell a, an input cell b and an output cell c through an anode terminal, and may output and record IMP operation results through the state combination of the input cell a and the input cell b and the state change c' of the output cell which are dependent upon the states of the input cell a, input cell b and output cell c in a truth table 810.

The truth table 810 is divided into a first step 811, a second step 812 and a third step 813. The first step 811 is a step of combining the state of the input cell a and the state of the input cell b for NOR operation, the second step 812 is a step of initializing the state of the output cell c for NOR operation, and the third step 813 is a step of performing an IMP operation between the input cell a+b and the output cell c for NOR operation.

The second step 812 may be a step of applying a negative voltage to the anode terminal of the output cell c and initializing the state.

The stateful logic-in-memory 800 implements NOR operation using three silicon diodes and through an IMP operation.

The stateful logic-in-memory 800 uses the silicon diode illustrated in FIG. 1c, and electrically dopes the channel region by the work function of the electrostatic doping electrode as the electrostatic doping electrode is connected to the ground.

The IMP operation of the stateful logic-in-memory 800 uses two silicon diodes connected in parallel with a series resistance of 1 MΩ.

FIG. 8b illustrates an operation timing diagram of the stateful logic-in-memory 800 of FIG. 8a.

Referring to FIG. 8b, a timing diagram 820 divides a lead input section 821, IMP operation section 822 and read output section 823 where the operation voltages $V_A$, $V_B$ and $V_C$ are input to the input cell a, the input cell b and the output cell c through the anode terminal, and show changes in the magnitude of voltage applied to each of the sections and changes in current applied thereto.

The timing diagram 820 shows that, when a read voltage $V_{Read}$ of 1.2V and a write voltage $V_{Write}$ of 1.3 V are applied to the input cell a and the input cell b and, accordingly, IMP operation between the combination of the input cell a and the input cell b and the output cell c is performed, the IMP operation result is reflected in the output cell c.

The stateful logic-in-memory of the present invention includes two input cells of at least one input cell and an output cell.

The output cell may receive the set voltage as a negative voltage, thereby being reset to a low state.

For example, the stateful logic-in-memory applies the read voltage to two input cells, and performs IMP operation between the OR operation result of the state of two input cells and the output cell.

In addition, the stateful logic-in-memory may store a NOR operation value between one input cell of the two input cells and the other input cell thereof, based on the IMP operation, in the output cell.

That is, the stateful logic-in-memory may perform NOR operation between the state of the input cell a and the state of the input cell b based on the plural memory cells, composed of two input cells and one output cell, and the IMP operation.

In addition, from the timing diagram 820, it can be confirmed that the current measurement results correspond to the truth table 810.

Figure 9A:
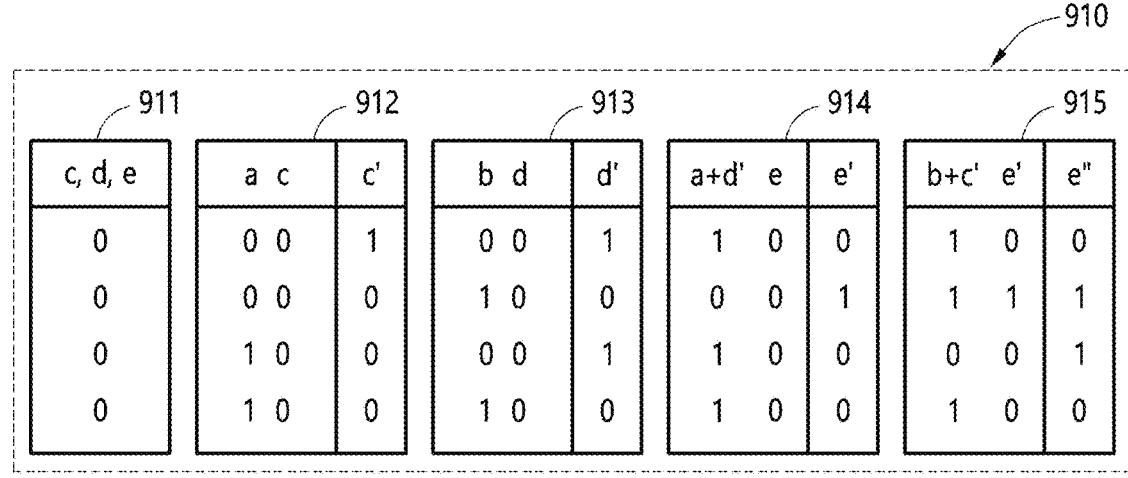
FIGS. 9a and 9b illustrate the XOR logic operation of the stateful logic-in-memory according to an embodiment of the present invention.
Figure 9B:
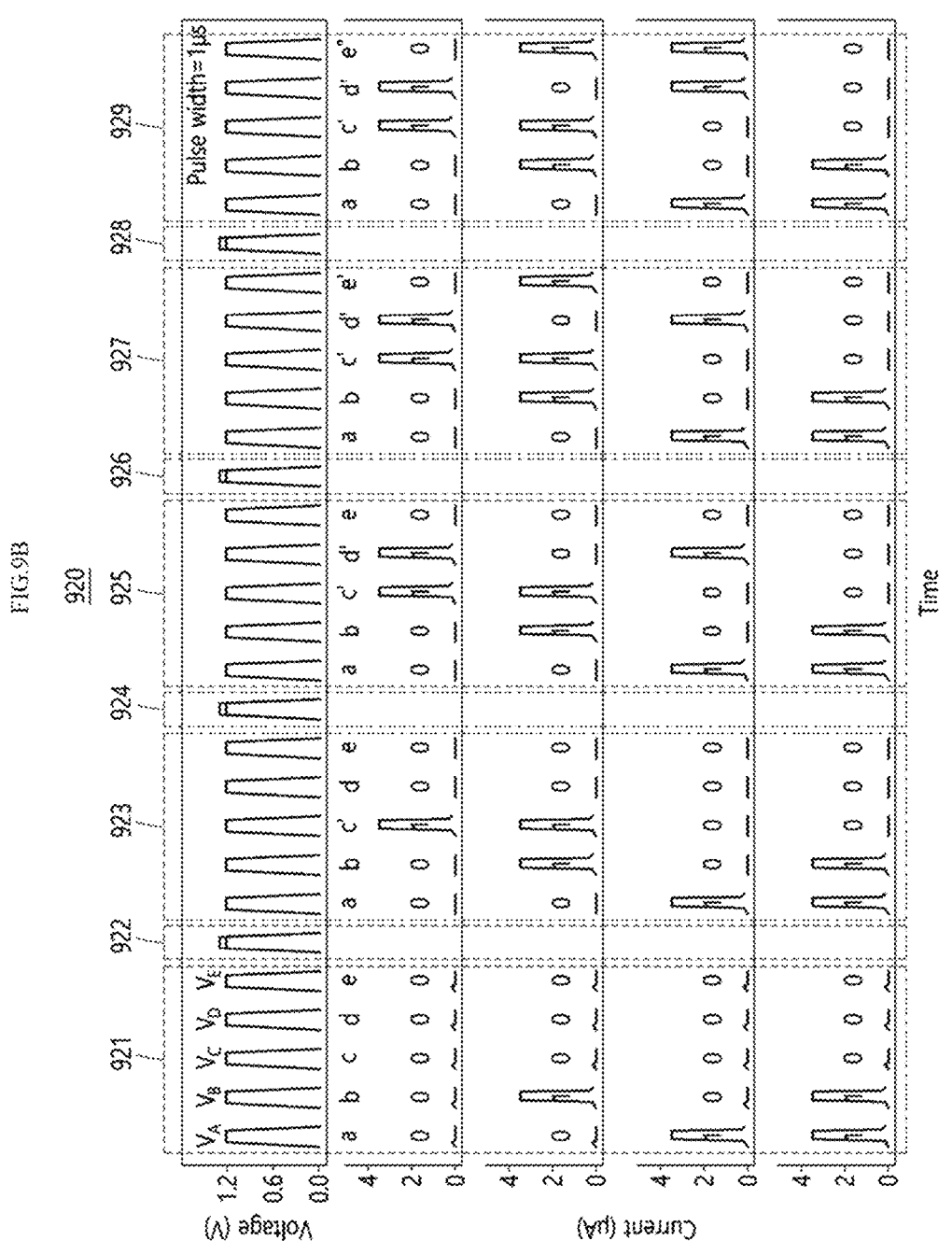

FIGS. 9a and 9b illustrate the XOR logic operation of the stateful logic-in-memory according to an embodiment of the present invention.

FIGS. 9a and 9b illustrate XOR operation according to the IMP operation of the stateful logic-in-memory using the silicon diode of the present invention.

Referring to FIG. 9a, a stateful logic-in-memory 900 applies operation voltages $V_A$, $V_B$, $V_C$, VD and VE to an input cell a, an input cell b, an input cell c, an input cell d and an output cell e through an anode terminal, and may perform XOR operation through a first step 911, second step 912, third step 913, fourth step 914 and fifth step 915 in a truth table 910.

In the first step 911, the stateful logic-in-memory 900 initializes the state to a low state by applying a negative voltage to anode terminals of the input cell c, the input cell d and the output cell e.

In the second step 912, the stateful logic-in-memory 900 performs IMP operation between the input cell a and the input cell c to change the state of the input cell c. The input cell c whose state has been changed is indicated as an input cell c'.

In the third step 913, the stateful logic-in-memory 900 performs IMP operation between the input cell a and the input cell d to change the state of the input cell d. The input cell d whose state has been changed is indicated as an input cell d'.

In the fourth step 914, the stateful logic-in-memory 900 performs IMP operation between an input cell a+d' and an input cell e to change the state of the input cell e. The input cell e whose state has been changed is indicated as the input cell e'.

In the fifth step 915, the stateful logic-in-memory 900 performs IMP operation between an input cell b+c' and the input cell e' to change the state of the input cell e'. The input cell e' whose state has been changed is indicated as an input cell e''.

The stateful logic-in-memory 900 implements XOR operation using five silicon diodes and four IMP operations.

The stateful logic-in-memory 900 uses the silicon diode described in FIG. 1c, and electrically dopes the channel region by the work function of the electrostatic doping electrode as the electrostatic doping electrode is connected to the ground.

The IMP operation of the stateful logic-in-memory 900 uses five silicon diodes connected in parallel with a series resistance of 1 MΩ.

FIG. 9b illustrates an operation timing diagram of the stateful logic-in-memory 900 of FIG. 9a.

Referring to FIG. 9b, a timing diagram 920 divides a lead input section 921, first IMP operation section 922, first read output section 923, second IMP operation section 924, second read output section 925, third IMP operation section 926, third read output section 927, fourth IMP operation section 928 and fourth read output section 929 where operation voltages $V_A$, $V_B$. $V_C$, VD and VE are input to an input cell a, an input cell b, an input cell c, an input cell d and an output cell e through the anode terminal, and illustrates changes in the magnitude of voltage applied to each of the sections and changes in current applied thereto.

The timing diagram 920 records and maintains, after a read voltage $V_{Read}$ of 1.2V and a write voltage $V_{Write}$ of 1.3 V are applied to the input cell a, the input cell b, the input cell c, the input cell d and the output cell e to initialize the states of the input cell c, the input cell d and the output cell e, the XOR operation result value, where a first IMP operation result between the input cell a and the input cell c is reflected in the input cell c to become the input cell c', a second IMP operation result between the input cell b and the input cell d is reflected in the input cell d to become the input cell d', a third IMP operation result between a combination of the input cell a and the input cell d' and the output cell e is reflected in the output cell e to become the output cell e', and a fourth IMP operation result between a combination of the input cell b and the input cell c' and the output cell e' is reflected in the output cell e' to become the output cell e'', in the output cell e.

That is, the stateful logic-in-memory may perform four IMP operations in order and store the XOR operation result values of the input cell a and the input cell b in the output cell e.

The stateful logic-in-memory of the present invention includes the first to fourth input cells and the output cell, and the third and fourth input cells of the first to fourth input cells and the output cell receive a negative voltage as a set voltage to reset to a low state.

The stateful logic-in-memory according to an embodiment of the present invention stores a first operation result, obtained by performing IMP operation between a first input cell and a third input cell, as a state of the third input cell, and stores a second operation result, obtained by performing IMP operation between a second input cell and a fourth input cell, as a state of the fourth input cell.

In addition, the stateful logic-in-memory performs XOR operation by performing IMP operation between the OR operation result between the first input cell and the second operation result and the output cell to store a third operation result as the state of the output cell and by performing IMP operation between the OR operation result between the second input cell and the first operation result and the output cell to store a fourth operation result as the state of the output cell.

In addition, from the timing diagram 920, it can be confirmed that the current measurement results correspond to the truth table 910.

Therefore, the present invention can implement a stateful logic-in-memory using silicon diodes capable of performing both a memory function and a logic operation function.

In the aforementioned embodiments, constituents of the present invention were expressed in a singular or plural form depending upon embodiments thereof.

However, the singular or plural expressions should be understood to be suitably selected depending upon a suggested situation for convenience of description, and the aforementioned embodiments should be understood not to be limited to the disclosed singular or plural forms. In other words, it should be understood that plural constituents may be a singular constituent or a singular constituent may be plural constituents.

While the embodiments of the present invention have been described, those skilled in the art will appreciate that many modifications and changes can be made to the present invention without departing from the spirit and essential characteristics of the present invention.

Therefore, it should be understood that there is no intent to limit the invention to the embodiments disclosed, rather, the invention is to cover all modifications, equivalents, and alternatives falling within the spirit and scope of the invention as defined by the claims.

The invention claimed is:

1. A stateful logic-in-memory using silicon diodes, wherein the stateful logic-in-memory comprises a plurality of silicon diodes respectively comprising an anode region, a first channel region, a second channel region and a cathode region and being respectively comprised as memory cells, wherein each of the plural memory cells is connected in series with a resistor after a terminal of the cathode region is connected in parallel with a terminal of another cathode region, and receives operation voltage through a terminal of the anode region, and the plural memory cells comprise at least one input cell and output cell, perform implication (IMP) calculation at least once based on the received operation voltage and states of the at least one input cell and output cell, and change or maintain the state of the output cell based on the IMP operation performed at least once to perform a logic operation function and a memory function.

2. The stateful logic-in-memory according to claim 1, wherein the at least one input cell receives one voltage of a set voltage, a hold voltage and a read voltage among the operation voltage, wherein, when the set voltage is a positive voltage, a state is determined as a high state, thereby being turned on, and, when the set voltage is a negative voltage, a state is determined as a low state, thereby being turned off, and the output cell receives one voltage of a set voltage, a hold voltage and a write voltage among the operation voltage, wherein, when the set voltage is a positive voltage, a state is determined as a high state, thereby being turned on, and, when the set voltage is a negative voltage, a state is determined as a low state, thereby being turned off, wherein the state is maintained or changed based on the write voltage.

3. The stateful logic-in-memory according to claim 2, wherein the plural memory cells are turned on based on a latch-up phenomenon in the first channel region and the second channel region when the set voltage is the positive voltage corresponding to a greater voltage than a reference voltage for generating a positive feedback loop in the first channel region and the second channel region, and are turned off based on a latch-down phenomenon in the first channel region and the second channel region when the set voltage is the negative voltage corresponding to a smaller voltage than the reference voltage.

4. The stateful logic-in-memory according to claim 2, wherein the stateful logic-in-memory comprises one input cell of the at least one input cell and the output cell, and the stateful logic-in-memory has a larger resistance value than the resistor connected in series as the one input cell is turned off when the one input cell is in a low state and the output cell is in a low state or a high state, and performs an IMP operation, where the output cell is changed from a low state to a high state or maintains a high state, based on the write voltage applied to the output cell because the read voltage applied to the input cell is not applied to the resistor based on the larger resistance value.

5. The stateful logic-in-memory according to claim 2, wherein the stateful logic-in-memory comprises one input cell of the at least one input cell and the output cell, and the stateful logic-in-memory has a smaller resistance value than the resistor connected in series as the one input cell is turned on when the one input cell is in a high state and the output cell is in a low state or a high state, and performs an IMP operation, where the output cell maintains a previous low state or high state, as the write voltage and read voltage applied to the output cell are canceled out while the read voltage applied to the input cell is applied to the resistor based on the smaller resistance value.

6. The stateful logic-in-memory according to claim 2, wherein the stateful logic-in-memory comprises one input cell of the at least one input cell and the output cell, the output cell receives the set voltage as a negative voltage, thereby being reset to a low state, and the stateful logic-in-memory has a larger resistance value than the resistor connected in series as the one input cell is turned off when the one input cell is in a low state and the output cell is in a low state, and performs an IMP operation, where the output cell is changed from a low state to a high state, based on the write voltage applied to the output cell because the read voltage applied to the input cell is not applied to the resistor based on the larger resistance value.

7. The stateful logic-in-memory according to claim 6, wherein the stateful logic-in-memory has a smaller resistance value than the resistor connected in series as the one input cell is turned on when the one input cell is in a high state and the output cell is in a low state, and performs an IMP operation, where the output cell maintains a previous low state, as the write voltage and read voltage applied to the output cell are canceled out while the read voltage applied to the input cell is applied to the resistor based on the smaller resistance value.

8. The stateful logic-in-memory according to claim 2, wherein the stateful logic-in-memory comprises two input cells of the at least one input cell and the output cell, the output cell receives the set voltage as a negative voltage, thereby being reset to a low state, the stateful logic-in-memory performs a first IMP operation between one input cell of the two input cells and the output cell, the stateful logic-in-memory performs a second IMP operation between another input cell of the two input cells and the output cell, and the stateful logic-in-memory stores a NAND operation result value between the one input cell and the another input cell in the output cell based on the first IMP operation and the second IMP operation.

9. The stateful logic-in-memory according to claim 2, wherein the stateful logic-in-memory comprises two input cells of the at least one input cell and the output cell, the output cell receives the set voltage as a negative voltage, thereby being reset to a low state, the read voltage is applied to the two input cells, and IMP operation between an OR operation result of a state of the two input cells and the output cell is performed, and the stateful logic-in-memory stores a NOR operation result value between the one input cell and the another input cell, based on the IMP operation, in the output cell.

10. The stateful logic-in-memory according to claim 2, wherein the stateful logic-in-memory comprises first to fourth input cells of the at least one input cell and the output cell, the third and fourth input cells of the first to fourth input cells and the output cell receive the set voltage as a negative voltage, thereby being reset to a low state, the stateful logic-in-memory performs IMP operation between the first input cell and the third input cell to store a first operation result as a state of the third input cell, the stateful logic-in-memory performs IMP operation between the second input cell and the fourth input cell to store a second operation result as a state of the fourth input cell, the stateful logic-in-memory performs IMP operation between an OR operation result of the first input cell and the second operation result and the output cell to store a third operation result as a state of the output cell, and the stateful logic-in-memory performs IMP operation between an OR operation result of the second input cell and the first operation result and the output cell to store a fourth operation result as a state of the output cell.

11. The stateful logic-in-memory according to claim 1, wherein the anode region and the second channel region are in a p-doped state, and the cathode region and the first channel region are in an n-doped state.

12. The stateful logic-in-memory according to claim 1, wherein, when an electrostatically doped electrode is deposited on the first channel region, each of the plural memory cells electrically dopes the first channel region by a work function of the electrostatic doping electrode by grounding the electrostatic doping electrode, or electrically dopes the first channel region through an electric field applied by applying voltage to the electrostatic doping electrode.

* * * * *